United States Patent [19]
Imamiya et al.

[11] Patent Number: 5,640,365
[45] Date of Patent: Jun. 17, 1997

[54] SEMICONDUCTOR MEMORY DEVICE WITH A DECODING PERIPHERAL CIRCUIT FOR IMPROVING THE OPERATION FREQUENCY

[75] Inventors: Keniti Imamiya, Kawasaki; Shinji Miyano; Katsuhiko Sato, both of Yokohama; Tomoaki Yabe, Kawasaki, all of Japan

[73] Assignee: Kabushiki Kaisha Toshiba, Kawasaki, Japan

[21] Appl. No.: 524,630

[22] Filed: Sep. 7, 1995

[30] Foreign Application Priority Data

Sep. 9, 1994 [JP] Japan .................................... 6-216308

[51] Int. Cl.$^6$ ..................................................... G11C 7/00
[52] U.S. Cl. .................... 365/236; 365/200; 365/230.06; 365/233
[58] Field of Search ..................................... 365/194, 203, 365/200, 236, 230.06, 233; 371/10.2, 10.3

[56] References Cited

U.S. PATENT DOCUMENTS 4,556,975 12/1985 Smith et al. ............................ 365/200
4,951,253 8/1990 Sahara et al. ........................... 365/200

OTHER PUBLICATIONS

1995 IEEE International Solid–State Circuits Conference, Digest of Technical Papers, pp. 130–131, K. Imamiya et al., "A 35ns–Cycle–Time 3.3V–Only 32Mb NAND Flash EEPROM".

Primary Examiner—Joseph A. Popek
Attorney, Agent, or Firm—Banner & Witcoff, Ltd.

[57] ABSTRACT

A data register that stores the data corresponding to the selected memory cell in a memory cell array is provided near the memory cell array. A decoder that selects the data from the data register starts decoding in response to an address signal accessing the memory cells in synchronization with a clock signal determining the operation period. In the first half of an operation period of the clock signal, the decoder outputs a signal in response to a signal corresponding to the address signal determined in the preceding operation period. According to the output of the decoder, the data register is selected. In the latter half of the operation period, a signal corresponding to a new address signal for the next operation period is transferred to the decoder. By doing this, the output control signal in the decoder is caused to synchronize with a signal driving an address signal, enabling the proper address to be selected without fail.

27 Claims, 11 Drawing Sheets

SEMICONDUCTOR MEMORY DEVICE WITH A DECODING PERIPHERAL CIRCUIT FOR IMPROVING THE OPERATION FREQUENCY

BACKGROUND OF THE INVENTION

1. Field of the Invention

This invention relates to a semiconductor memory device that performs time-division operation, and more particularly to a decoding peripheral circuit that improves the operating frequency.

2. Description of the Related Art

Semiconductor memory devices speed up the input/output of data using the pipelining scheme. The pipelining scheme is a technique for effecting time-division memory accessing. This technique divides a memory access into two to three pipelining stages and thereby achieves data transfer at a high frequency.

Figure 1:
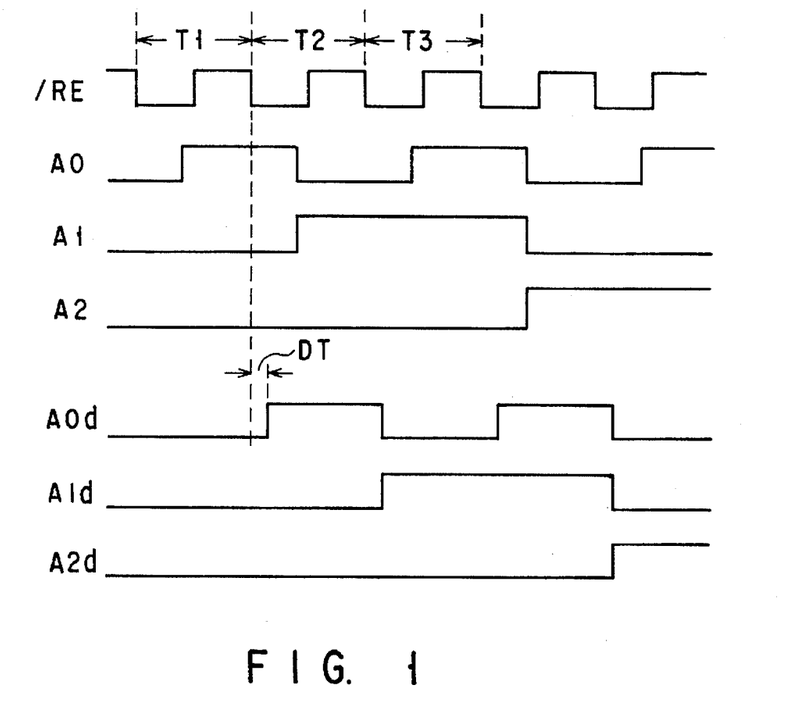
FIG. 1 is a timing chart for the counting up of a conventional address signal using an external clock.

FIG. 1 is a timing chart for the counting up of a conventional address signal using an external clock. This is related to the type that takes in a clock signal from an external circuit and generates an address signal internally. The external clock signal is here called a read enable signal/RE (the reverse of signal RE, a rising signal). In the figure, a 3-bit address signal is shown as an example.

Figure 2:
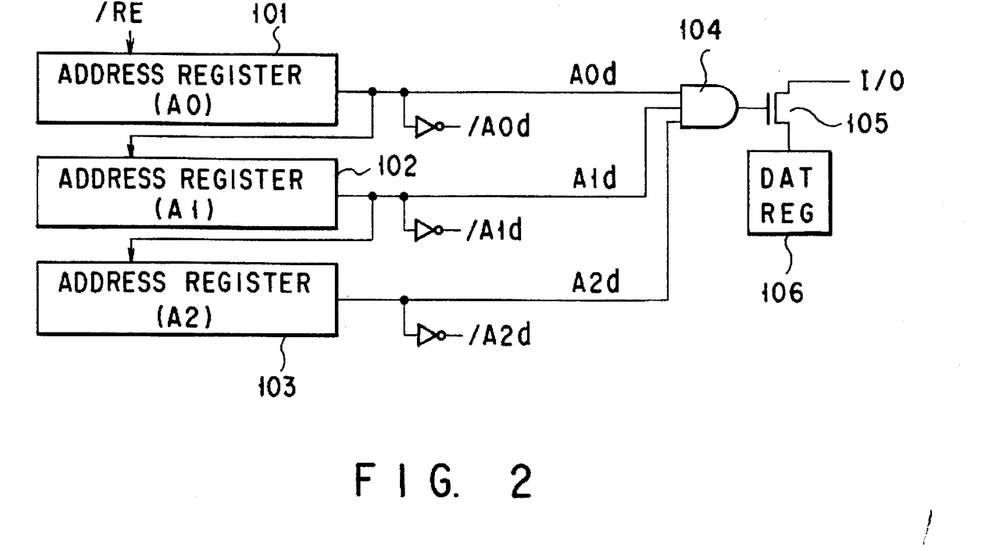
FIG. 2 is a circuit diagram of a column decoding means, centering around the necessary component parts to which the signals of FIG. 1 are applied.

FIG. 2 is a circuit diagram of a column decoding means, centering around the necessary component parts to which the signals of FIG. 1 are applied. A column gate 105 is controlled via a decoder 104 that is operated according to the outputs of address registers 101 to 103 formed within an address buffer. One end of the current path of the column gate 105 is connected to a data register 106 that retains the data in a memory cell and its other end is connected to an input/output terminal I/O of the data.

An explanation will be given with reference to FIGS. 1 and 2. The address signals (A2, A1, A0) held in the address registers 101 to 103 are incremented from (0, 0, 0) to (0, 0, 1). (A2, A1, A0) is the address signal held in the address buffer and (A2d, A1d, A0d) is the address signal received by the decoder.

Namely, when the address signal held in the address registers changes, the decoder 104 receives the address signal at the falling edge of signal/RE. That is, the actual address signal output does not begin until period T2 starts. In period T2, the cell for the address signal (0, 0, 1) is selected and the data in the selected cell is latched in a data register. In period T3, an output buffer (not shown) outputs the data. In this way, by counting up the address signal for one period in advance, the time required to count up the address signal is reduced. This makes it possible to read the memory according to the address signal in a shorter period.

As described above, the address signal is actually outputted to the decoder after period T2 in the read operation has started. Therefore, a delay time of DT from when the address signal left the address buffer (address register) until it reaches the decoder is added to the read cycle. That is, in period T2, a practical memory access operation is carried out in such a manner that after the decoding operation corresponding to the specified address signal, the address for the corresponding memory cell is accessed via the data register 106.

Therefore, period T2 contains a critical path, the most time-consuming part of the memory access operation. In the critical path, circuits containing an analog operation region where a potential is transmitted to a bit line or a data line are operated. Thus, the operating frequency of the memory device is virtually synchronized with period T2. When period T2 contains a delay time of DT, this means that it is very difficult to make operation faster by making the period of clock signal as short as possible.

Furthermore, memory devices provided with redundancy circuits for relieving defective memory cells are available. The redundancy circuit senses that the address signal corresponding to a defective memory cell has been inputted, stops accessing the defective memory cell, and selects a redundancy cell (a spare memory cell) in place of the defective one. If the redundancy circuit was provided in a memory device of the above-described synchronization type, the device would be caused to operate in the pipelining stage of period T2 with a critical path. Since the redundancy circuit contains the operation of judging whether or not the signal is the address signal specifying the defective memory cell, this makes the critical path longer, preventing the maximum operating frequency from being improved.

SUMMARY OF THE INVENTION

The object of the present invention to provide a semiconductor memory device where the column decoding peripheral circuit is constructed so that a delay time impairing the operation margin as described above and the operating time of the redundancy circuit may have no effect on the critical path.

The foregoing object is accomplished by providing a semiconductor memory device comprising: an address signal generating circuit that outputs an address signal counted up sequentially by a clock signal determining the operation period, within the counting-up operation period; a decoder that, being synchronized with the clock signal, outputs a signal for accessing the data line corresponding to the previously transferred address signal at the time when the operation period starts which follows the counting-up operation period and in which the data line corresponding to the address signal from the address signal generating circuit is accessed; and a memory cell array composed of a plurality of memory cells having addresses accessed by the decoder, wherein the address signal counted-up in the preceding period is decoded in an operation period and the address corresponding to the address signal is accessed, and at the same time, an address signal for the following period is counted up at the address signal generating circuit and transmitted to the decoder.

The foregoing object is further accomplished by providing a semiconductor memory device comprising: a memory cell array in which a plurality of memory cells for storing data are arranged in a matrix; a decoder for selecting one column line connected to the memory cells; address signal latching means for determining an address signal to access the memory cells in synchronization with a clock signal determining the operation period; redundancy circuit means which contains redundancy address sensing means that judges whether or not the address signal is a redundancy address specifying a column containing a defective memory cell and, when a redundancy address is sensed, determines the signal corresponding to the address signal to be a signal to a spare decoder among the decoders and switches the transfer path, and which, when a redundancy address is sensed, selects one column line corresponding to a previously prepared spare memory cell in place of the defective memory cell; and signal transfer control means that has previously finished the redundancy address sensing means in a operation period before a first operation period in which the decoder selects the column line corresponding to the address signal, and produces the signal necessary for the control of the decoder as soon as the first operation period starts.

With the configuration of the present invention, an address signal transfer delay time impairing the operation margin is not added to the period of the memory access operation. Because the signal used to select the decoder is synchronized with the signal used to drive the address signal, the proper address is selected without fail. When a redundancy circuit is provided, the address signal redundancy judging operation is carried out in a pipelining stage before the pipelining stage for the memory access, with the result that the critical path is not impaired. It is expected that a semiconductor memory device can be made faster, making the operation period of the memory much shorter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 3:
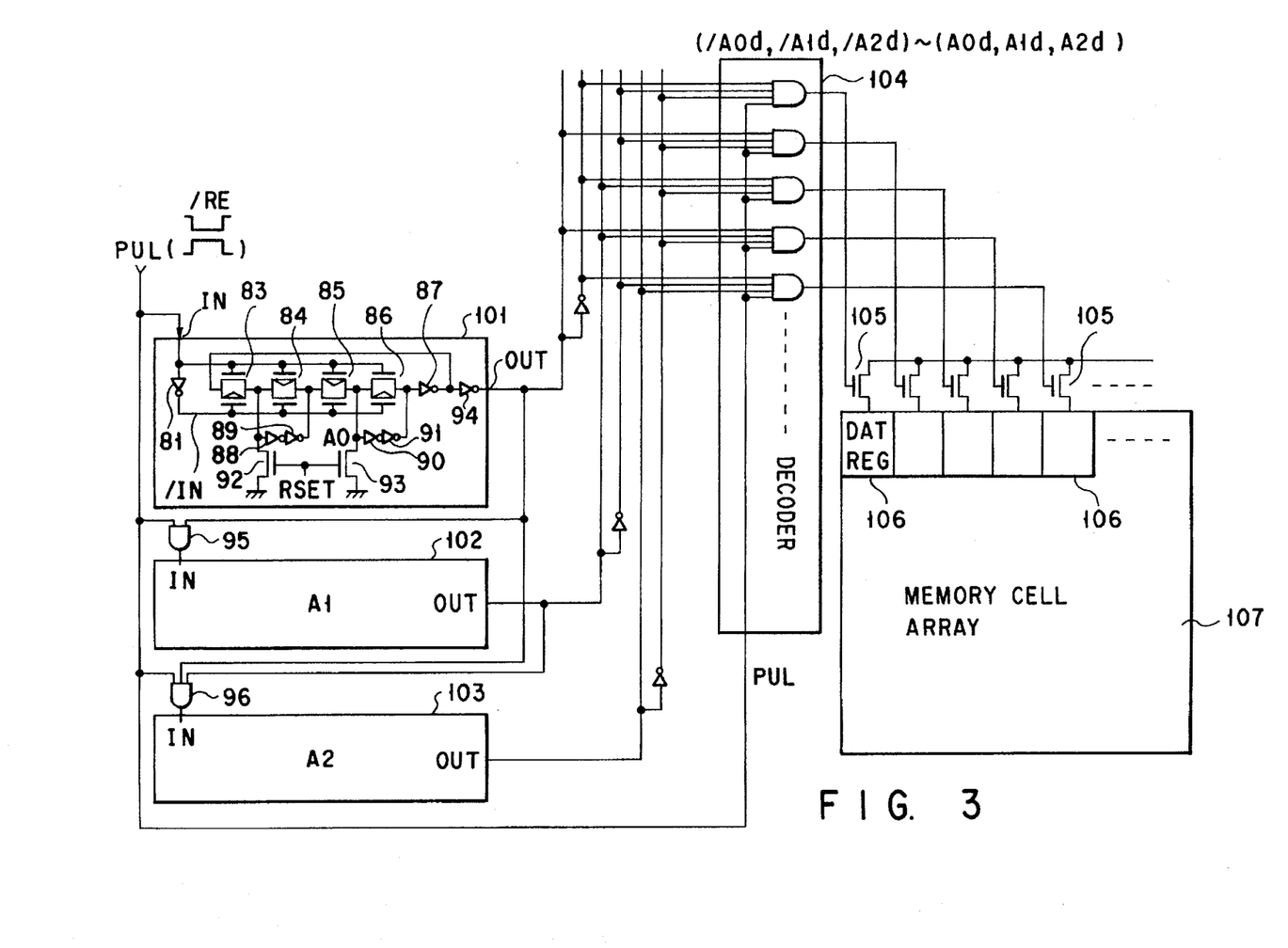
FIG. 3 is a circuit diagram of the important portion of column decoding means according to a first embodiment of the present invention.

FIG. 3 is a circuit diagram of the primary portion of a column decoding means related to a semiconductor memory device according to a first embodiment of the present invention. A 3-bit address signal output means is composed of address registers 101, 102, 103 controlled by an inverted signal PUL, the reverse of the reading signal/RE. That is, the address register 101, when receiving the signal PUL, outputs an address signal A0. When being supplied with the output of a 2-input AND gate 95 to which address signal A0 and signal PUL are inputted, the address register 102 outputs address signal A1. When being supplied with the output of a 3-input AND gate 96 to which address signals A1 and A2 and signal PUL are inputted, the address register 103 outputs address signal A2.

The address registers 101, 102, 103 have the same structure and are constructed as follows. CMOS transfer gates 83, 84, 85, 86 that are controlled by the input signal IN and the inverted signal/IN from an inverter 81, are connected in series. The transfer gates 83, 86 are constructed so that the p-channel MOS transistors may be gate-controlled by signal/IN and the n-channel MOS transistors may be controlled by signal IN. The transfer gates 84, 85 are constructed so that the n-channel MOS transistors may be gate-controlled by signal/IN and the p-channel MOS transistors may be controlled by signal IN. The transfer gate 86 is inputted to an inverter 87, the output of which is inputted to the transfer gate 83.

Inverters 88, 89 are connected in series so as to be parallel with the current path of the transfer gate 84 to form a latch circuit, and inverters 90, 91 are connected in series so as to be parallel with the current path of the transfer gate 86 to form a latch circuit. The inverters 88, 90 are connected to resetting transistors 92, 93, respectively. Both gates of the transistors 92, 93 are controlled by a reset signal RSET. The output of the inverter 87 is inputted to the inverter 94. The output OUT of the inverter 94 is an address signal output. With this configuration, when input IN goes high (H) and then low (L), the output OUT is inverted. Namely, the address registers 101 to 103 are a binary counter where address signals A0, A1, A2 are changed by signal PUL.

Figure 4:
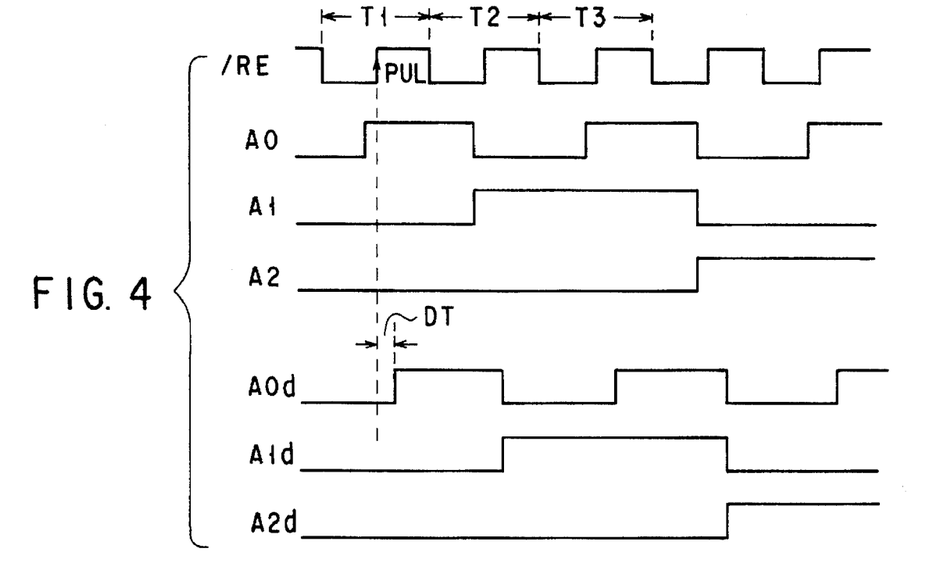
FIG. 4 is a timing chart for the counting up of an address signal in the configuration of FIG. 3.

FIG. 4 is a timing chart for the configuration of FIG. 3 of the invention to count up an address signal. This chart corresponds to that in FIG. 1 for a conventional equivalent. Signal PUL is synchronized with the reading signal/RE as described above. With this synchronization, the counting up of the address signal (A0, A1, A2) ends while signal/RE is low, and when signal/RE goes high, the next address signal, that is, (A0d, A1d, A2d) corresponding to the counted-up address signal (A0, A1, A2) is outputted, which is transferred to a decoder 104 (shown in FIG. 3).

Furthermore, signal PUL, the same signal as that operates the address registers 101 to 103, is inputted to the decoder 104 as well. With this input, at the time when signal/RE goes low, the data register 106 retaining the data in the cell selected in the memory cell array 107 transfers the data to an I/O bus in the chip via a column gate 105.

With the above configuration, because the signal (/RE) used to read the data is synchronized with the signal (PUL) used to drive the address signal, the proper address signal is selected without fail. As seen from FIG. 4, a delay time of DT over the path from the address buffer to the decoder is provided in a cycle (period T1) before the reading operation starts, with the result that the margin increases in the period of the reading operation. This makes the operation period of the memory shorter, contributing to a faster operation of the semiconductor memory device.

Figure 5:
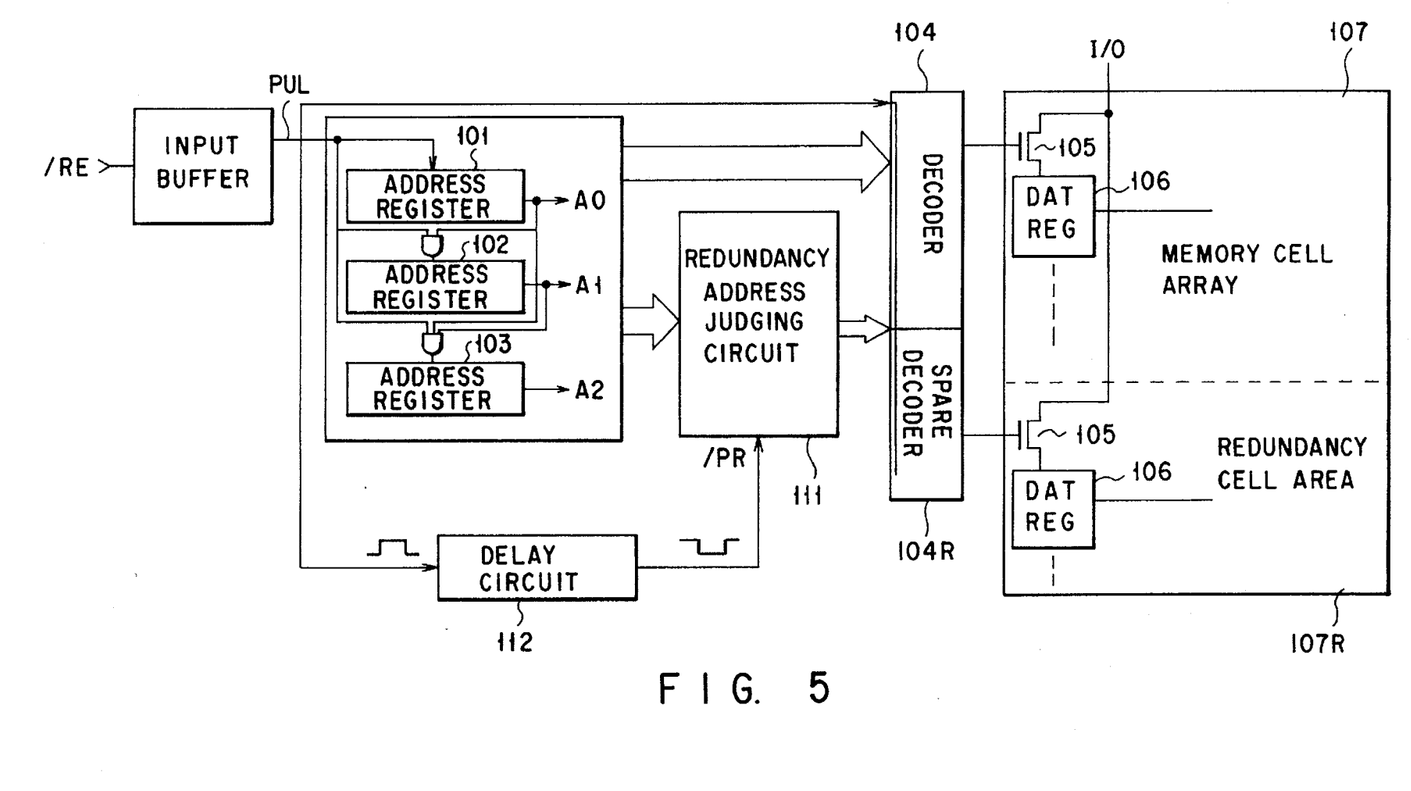
FIG. 5 is a circuit diagram of column decoding means with a redundancy circuit according to a second embodiment of the present invention.

FIG. 5 is a circuit diagram of a column decoding means provided with a redundancy circuit according to a second embodiment of the present invention. The same parts as those in FIG. 3 are indicated by the same reference symbols. It is well known that memory devices are provided with a redundancy circuit for relieving defective memory cells. The redundancy circuit comprises a redundancy address judging circuit 111, a delay circuit 112 that delays the signal/PR controlling the judging circuit until the proper address signal has reached the judging circuit, a spare decoder 104R controlled by the judgment signal from the judging circuit, and a redundancy cell area 107R in which spare memory cells (redundancy cells) to be selected by the spare decoder and a data register for holding the data in the redundancy cells are arranged.

The redundancy address judging circuit 111 senses an address signal and judges whether the redundancy circuit should be selected. When the column decoding means of the invention is used, the redundancy address judging circuit 111 must be modified, because it does not operate properly with the conventional configuration. The reason will be explained hereinafter.

Figure 6:
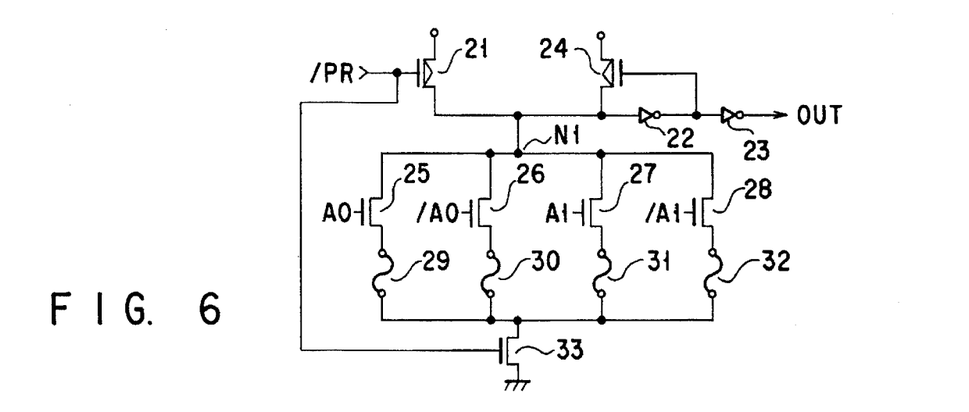
FIG. 6 is a circuit diagram of a redundancy address judging circuit prerequisite to the present invention.

FIG. 6 is a circuit diagram of the redundancy address judging circuit prerequisite to the present invention. The redundancy address judging circuit comprises a p-channel transistor 21 that brings node N1 into a high level by a precharging signal/PR, inverters 22, 23 connected in series that directs the level of node N1 to the output OUT, a p-channel transistor 24 whose gate is connected to the series connection point of the inverters 22, 23 and which feeds back the level of node N1, n-type transfer gates 25 to 28 connected in parallel to whose gates specific address signals (here, A0,/A0, A1,/A1) are supplied, fuse elements 29 to 32 one end of each of which is connected to the sources of the transfer gates 25 to 28, respectively, and an n-channel MOS transistor 33 controlled by signal/PR between the other ends of the fuse elements 29 to 32 and the ground.

Figure 7:
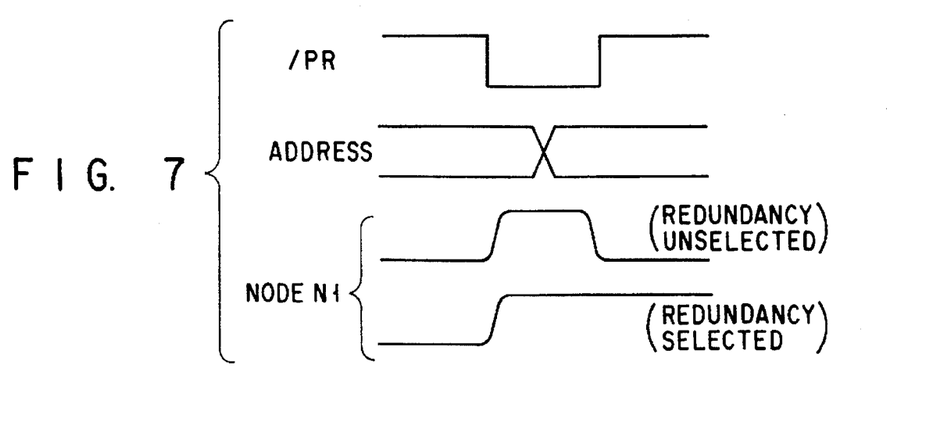
FIG. 7 is a waveform diagram of various parts in FIG. 6 in response to the address input signal.

FIG. 7 shows waveforms at various parts in FIG. 6 in response to the address signal input. In FIG. 6, for example, if address signal (A0, A1)=(0, 1) is defective, the fuses 30 and 31 are cut off. Here, a case where address signal (A0, A1)=(0, 1) is inputted will be considered. Node N1 is precharged to a high level as a result of transistor 21 turning on by signal /PR. When address signal (A0, A1)=(0, 1) is inputted, because the transistor 26, 27 that can be turned on have their fuses (30, 31) cut off, node N1 remains at a high level even after signal/PR has returned to a high level. This turns on transistor 24, making the output OUT high. Use of the high-level signal causes the ordinary decoder to be unselected, thereby selecting the spare decoder. This makes it possible to select a redundancy cell operating properly in place of the defective cell.

When an address signal other than the above address signal is inputted, the change of signal/PR from a low (precharge) to a high level forms a direct-current path from the transfer gates (25 to 28) to the fuse elements (29 to 32) and to the ground. As a result, node N1 discharges, bringing the output OUT into a low level. This low signal makes the spare decoder unselected and the ordinary decoder selected. When there is no defective cell, the fuse elements are left uncut. In this case, even if any address signal is inputted, the output OUT is low.

With the configuration of FIG. 6, the period from the falling edge to the rising edge of reading signal /RE of FIG. 1 is synchronized with the precharging signal/PR. That is, in the case of a memory operation cycle in which address signal selection and cell selection are performed during one operation period (T2) of the memory as shown in FIG. 1, there is no obstacle to operation.

With the present invention, however, as shown in FIG. 4, timing extends over two operation periods of the memory to achieve faster operation in such a manner that address signal n is outputted in period Tn and the data in the cell corresponding to address signal n is selected in period $T_{n+1}$. Furthermore, as described in detail in the timing chart of FIG. 8, when an attempt is made to effect the timing for precharging address signal n at the redundancy address judging circuit and the timing for selecting the cell corresponding to address signal n−1 simultaneously, the configuration of FIG. 6 cannot judge whether or not the redundancy circuit is selected, with the precharging timing.

Figure 9:
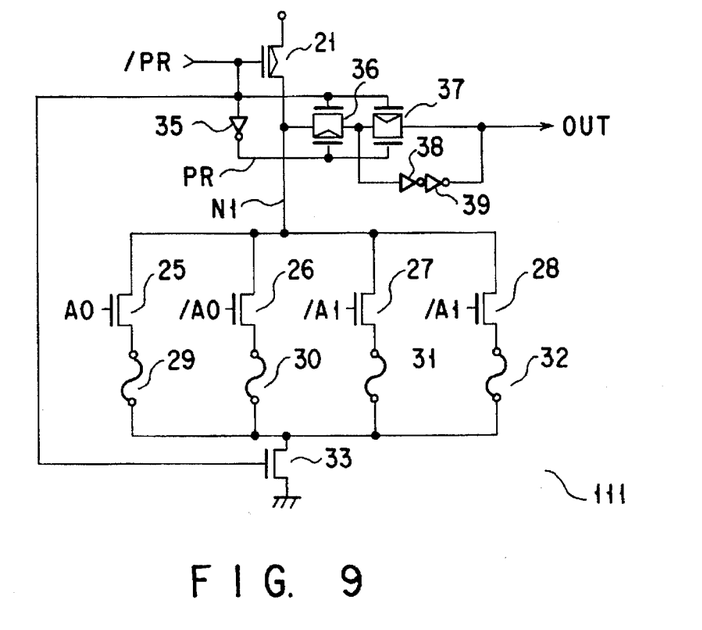
FIG. 9 is a concrete circuit diagram of the redundancy address signal judging circuit in FIG. 5 according to a semiconductor memory device of the present invention.

FIG. 9 is a concrete circuit of the redundancy address judging circuit 111 of FIG. 5 related to a semiconductor memory device according to the present invention. The redundancy address judging circuit comprises a p-channel transistor 21 that brings node N1 into a high level by precharging signal/PR, transfer gates 25 to 28 that determine the redundancy address signal, fuse elements 29 to 32, an n-channel MOS transistor 33 that is provided between the fuse elements 29 to 32 and gate-controlled by signal/PR, as that of FIG. 6 does. Node N1 is connected to the output OUT via a series connection of CMOS transfer gates 36, 37 gate-controlled by signal/PR and signal PR, the reverse of /PR, from an inverter 35, and a series connection of inverters 38, 39 is connected between the connection point of the transfer gates 36, 37 and the output OUT, thereby forming a latch circuit. The transfer gate 36 is designed so that an n-channel MOS transistor may be gate-controlled by signal/PR and a p-channel MOS transistor may be gate-controlled by signal PR. The transfer gate 37 is designed so that a p-channel MOS transistor may be gate-controlled by signal/PR and an n-channel MOS transistor may be gate-controlled by signal PR.

The operation of the circuit of FIG. 9 will be explained. When signal/PR goes low, node N1 is precharged to a power-supply potential. At this time, transfer gate 36 turns off, disconnecting the output OUT from node N1. On the other hand, transfer gate 37 turns on, causing the latch circuit to operate, placing the data on the redundancy address judgment obtained in the preceding cycle at the output OUT. Thereafter, signal/PR goes high, disconnecting node N1 from the power supply. As with the configuration of FIG. 6, when the spare decoder is not selected, node N1 is discharged to the ground level. When the spare decoder is selected, node N1 remains at a high level, which is transferred to the output OUT.

Although the connection of the output of the redundancy address judging circuit 111 thus constructed to the decoder 104 and the spare decoder 104R is not shown, the following configuration can be considered, for example. A control input is added to the AND gates constituting the ordinary decoder and the redundancy decoder. For example, a 4-input AND gate such as the decoder 104 of FIG. 3 is modified into a 5-input AND gate. Here, the new control input is determined to be S5. Then, an AND gate having signal PUL on one input is provided. The other input of the AND gate is determined to be the output OUT of the redundancy address judging circuit 111. The output of the AND gate is determined to be control input S5 of the spare decoder 104R. The reverse of the output of the AND gate is determined to be control input S5 of the decoder 104.

With the above configuration, even when the redundancy address judging circuit is being precharged, the cell selecting operation progresses. This makes it possible to output the redundancy address judging signal in a period before cell selection, enabling the redundancy address judging circuit to be incorporated into a circuit in the column decoding means to which the invention is applied. As a result, the memory operation can be made faster.

The redundancy address judging circuit of FIG. 9 is controlled by signal/PR. If the proper address signal has been determined before the arrival of signal PR, the judging circuit can operate erroneously. To avoid this problem, the delay circuit 112 is provided as shown in FIG. 5. If the delay time is too long, the margin will decrease in subsequent cell selecting operations at the decoder, preventing the memory operation period from being made faster. Therefore, it is necessary to give the optimum delay time to the delay circuit of FIG. 5.

Figure 10:
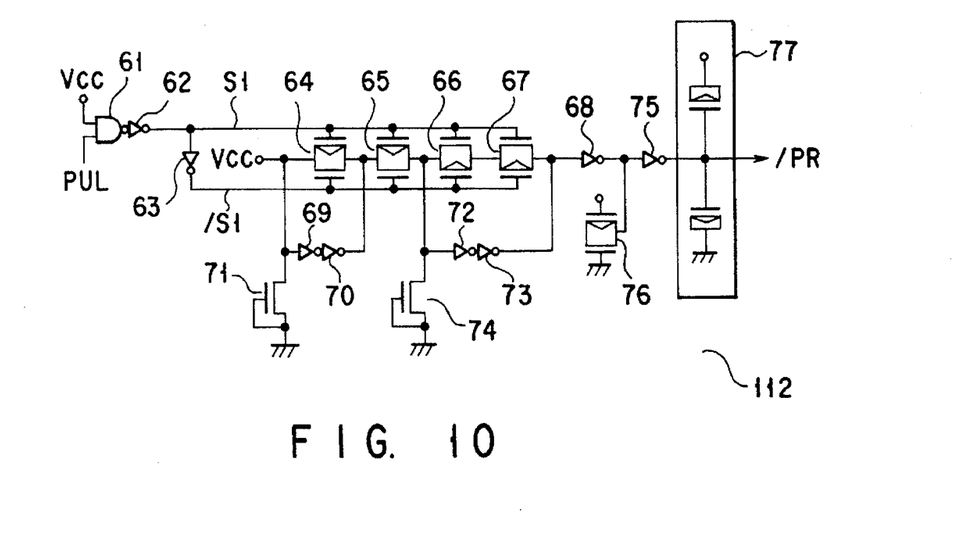
FIG. 10 is a concrete circuit diagram of the delay circuit in FIG. 5 according to a semiconductor memory device of the present invention.

FIG. 10 is a concrete circuit diagram of the delay circuit 112 of FIG. 5 in a semiconductor memory device of the present invention. For example, the delay circuit is composed of the same elements as those constituting the address register 102, and is designed to have a delay time equivalent to that of the address register. Specifically, a 2-input NAND gate 61 receiving signal PUL and a high-level signal and an inverter 62 are connected in series and produce signal S1. CMOS transfer gates 64, 65, 66, 67 gate-controlled by signal S1 and the inverted signal/S1 of S1 from an inverter 63 are connected in series and this series connection is connected to the input of an inverter 68. The transistor gates 64, 65 are designed so that the p-channel MOS transistors may be gate-controlled by signal S1 and the n-channel MOS transistors may be gate-controlled by signal/S1. The transistor gates 66, 67 are designed so that the n-channel MOS transistors may be gate-controlled by signal S1 and the p-channel MOS transistors may be gate-controlled by signal/S1. Inverters 69, 70 are connected in series so as to be parallel with the current path of the transfer gate 64. Between the input of the inverter 69 and the ground, the current path of an n-channel MOS transistor 71 whose gate and source are connected is connected. Between the connection point of the transfer gates 65 and 66 and the connection point of the transfer gate 67 and the inverter 68, inverters 72, 73 are connected in series. Between the input of the inverter 72 and the ground, the current path of an n-channel MOS transistor 74 whose gate and source are connected is connected. The input of inverter 75 is connected to the output of the inverter 68. The connection point of the inverters 68 and 75 is provided with an inoperative transistor junction section 76. The output of the inverter 75 is the output OUT of the delay circuit. A capacitance 77 equivalent to the capacity of the decoder is added before the output.

Figure 11:
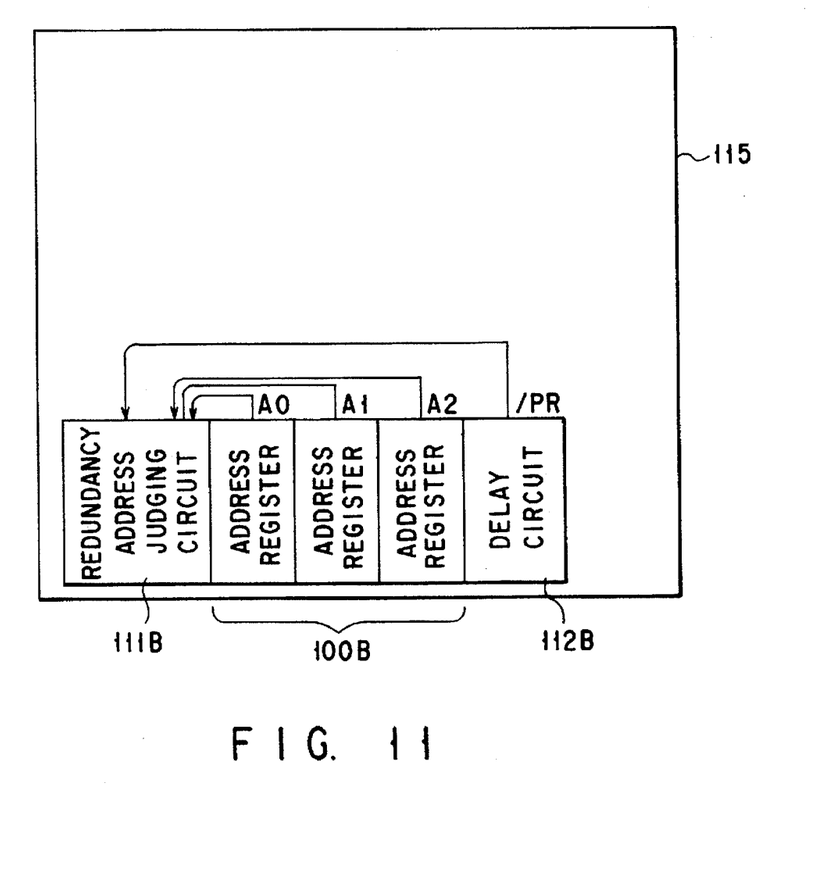
FIG. 11 shows the layout of the individual circuit blocks in a chip to which a semiconductor memory device of the present invention is applied.

With the above configuration, when the input signal PUL goes low, the output OUT rises with a delay time equivalent to the transfer speed of the address signal. Namely, the redundancy address judging circuit can be driven by the signal that has passed through a parasitic load equivalent to that of the address signal. Furthermore, the layout of the delay circuit in the chip may be as shown in FIG. 11, for example. Specifically, the block 112B of the delay circuit 112 is placed next to the block 100B of the address registers (101 to 103) in the chip 115, the farthest from the block 111B of the redundancy address judging circuit 111. This makes it possible to force a delay in the signal caused by the address signal passing through the wire to be contained in the delay time that the delay circuit has.

Therefore, whenever the driving signal (precharging signal/PR) is supplied from the delay circuit 112 to the redundancy address judging circuit 111, the address signal has been determined. Furthermore, because the delay circuit 112 has a delay equal to a delay in the address signal even when the temperature, the threshold voltage of the transistor, or the power-supply voltage changes, an extra margin is not needed in setting a delay time, contributing to the realization of higher-speed semiconductor memory devices.

Another point to be further considered about the driving signal (precharging signal) to the redundancy address judging circuit 111 will be given. In FIG. 9, when the high-level period (discharging period) of the precharging signal/PR is longer than necessary, even if a redundancy select address signal is given, the potential at node N1 that should not be discharged will drop due to the junction leakage at the transistors 25 to 28. This takes place when the period of the precharging signal/PR, or the period of the reading signal/RE of FIG. 4, is set longer than necessary, making it impossible to properly judge whether or not the redundancy circuit should be selected.

Figures 12, 13A:
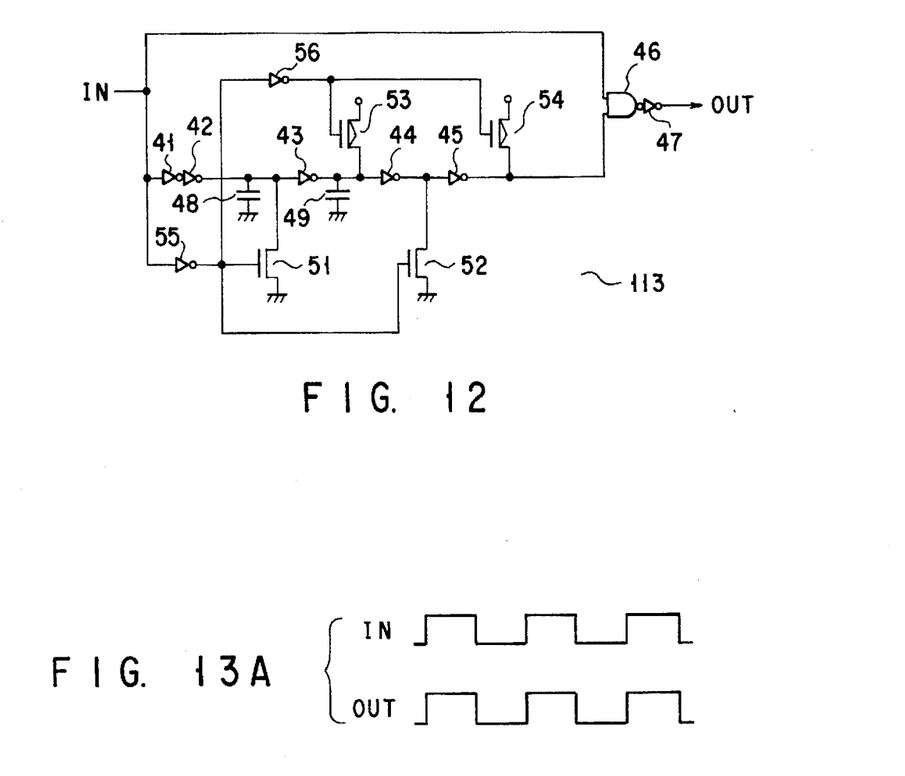
FIG. 12 is a circuit diagram of a signal control circuit related to a semiconductor memory device of the present invention.
FIGS. 13A and 13B are timing signal charts for the operation of the circuit in FIG. 12.

To overcome this problem, a signal control circuit of FIG. 12 is provided. The output of a 2-input NAND gate 46 that receives input IN and a signal obtained by allowing input IN to pass through serial five stages of inverters 41 to 45, is inputted to an inverter 47. The output of the inverter 47 is determined to be OUT. To delay the signal, a capacitor 48 is provided between the connection point of the inverters 42 and 43 and the ground, and a capacitor 49 is provided between the connection point of the inverters 43 and 44. Furthermore, to reset the node, an n-channel MOS transistor 51 is provided between the connection point of the inverters 42 and 43 and the ground, an n-channel MOS transistor 52 is provided between the connection point of the inverters 44 and 45 and the ground, a p-channel MOS transistor is provided between the connection point of the inverters 43 and 44 and the power supply, and a p-channel MOS transistor 54 is provided between the connection point of the inverter 45 and the NAND gate 46 and the power supply. The transistors 51, 52 are gate-controlled by input IN via the inverter 55. The transistors 53, 54 are gate-controlled by input IN via a series connection of the inverters 55, 56.

Figure 13B:
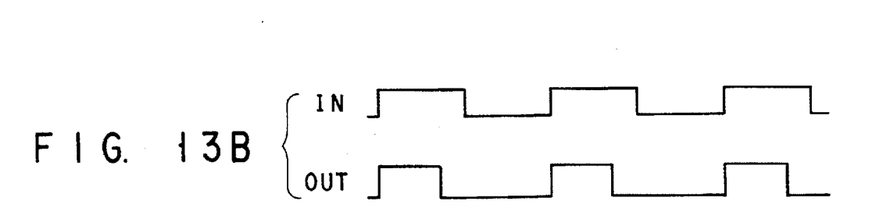

FIGS. 13A and 13B are timing signal charts for the operation of the circuit in FIG. 12. As shown in FIG. 13A, at the rising of signal IN, the two inputs of the NAND gate 46 both go high and the output OUT is high. When the period of signal IN is short, a change in the input is not transmitted to the output node 57 of the serial five stages of inverters 41 to 45 and the output node is fixed at a high level by the action of the transistors 51 to 54 controlled when signal IN was low.

On the other hand, when the period of signal IN is long as shown in FIG. 13B, because the period during which signal IN is high is long, a low level is transmitted to the output node 57 of the serial five stages of inverters 41 to 45.

At this time, the output OUT goes low. In a short time, the two inputs of the NAND gate 46 both go low. At this time, too, the output OUT remains at the low level.

Figure 14:
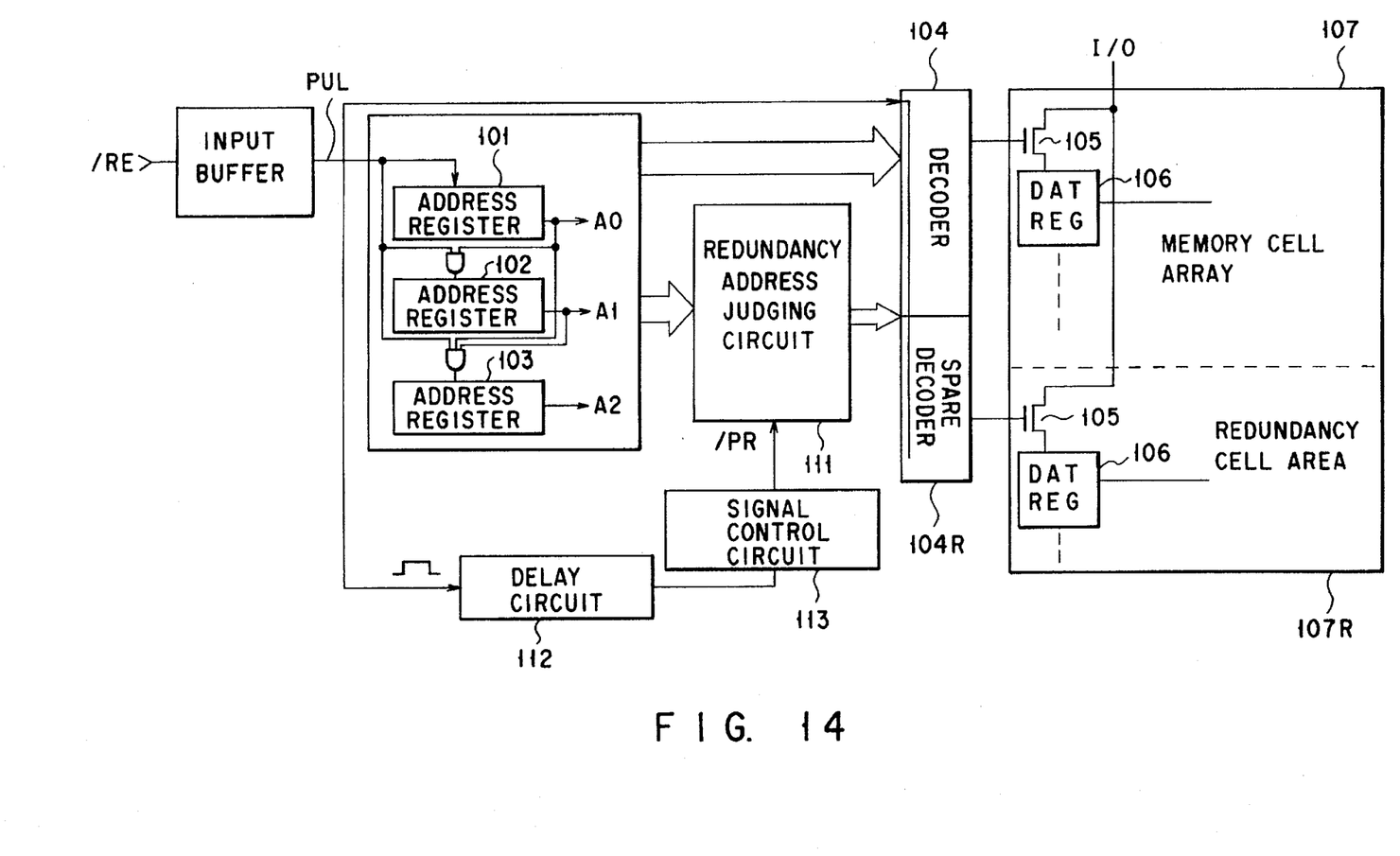
FIG. 14 is a block diagram of a third embodiment of the present invention, where the circuit of FIG. 12 is added to the configuration of FIG. 5.

FIG. 14 is a circuit diagram of the circuit of FIG. 12 added to the configuration of FIG. 5 according to a third embodiment of the present invention. By providing a signal control circuit as shown in FIG. 12 in the path ranging from the delay circuit to the redundancy address judging circuit, a discharging period within a certain time can be given to the redundancy address judging circuit, regardless of the signal period. This enables the redundancy address judging circuit to judge an address signal correctly. The signal control circuit of FIG. 12 may be built in the redundancy address judging circuit. The configurations of FIGS. 9, 10, and 12 are not restricted to the pipelining memory operation, but may be applied to another memory operation and can provide a circuit configuration assuring the operation margin.

Figure 8:
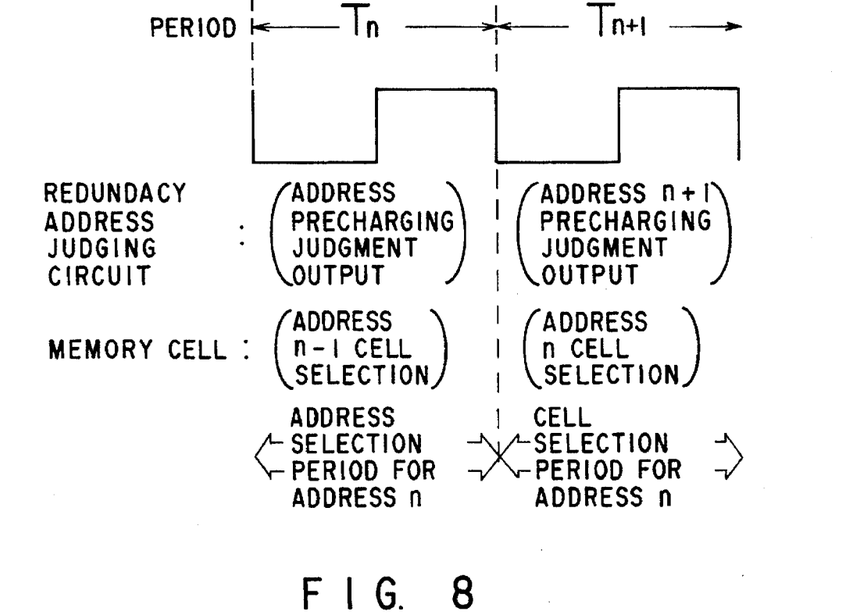
FIG. 8 is a timing chart for read control of two operation periods characterizing a semiconductor memory device of the present invention.
Figure 15:
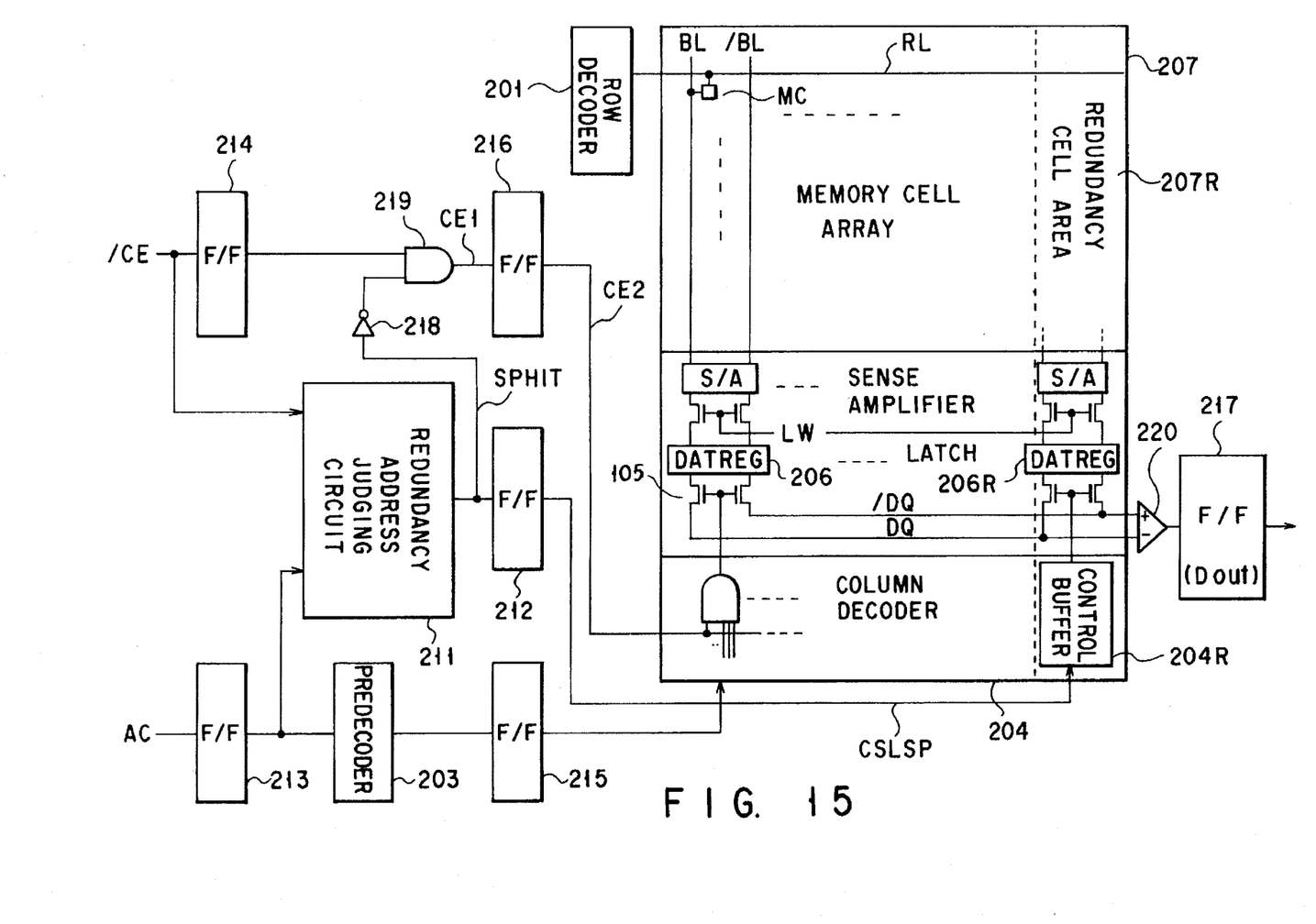
FIG. 15 is a circuit diagram of the important portion of a column decoding means in a semiconductor memory device according to a fourth embodiment of the present invention.

FIG. 15 is a block diagram of the major portion of a column decoding means in a semiconductor memory device according to a fourth embodiment of the present invention, where the characteristic memory accessing configuration of FIG. 8 according to the invention is applied to a memory device that takes in an address signal from the outside in synchronization with the clock signal. A latch (F/F) 212 is provided between the decoder 204 (204R) and the redundancy address judging circuit 211 so that the redundancy address judging circuit 211 may operate in a pipelining stage before the pipelining stage in which the decoder operates to read the data from the memory cells MC (including redundancy cells, although not shown).

Figure 16:
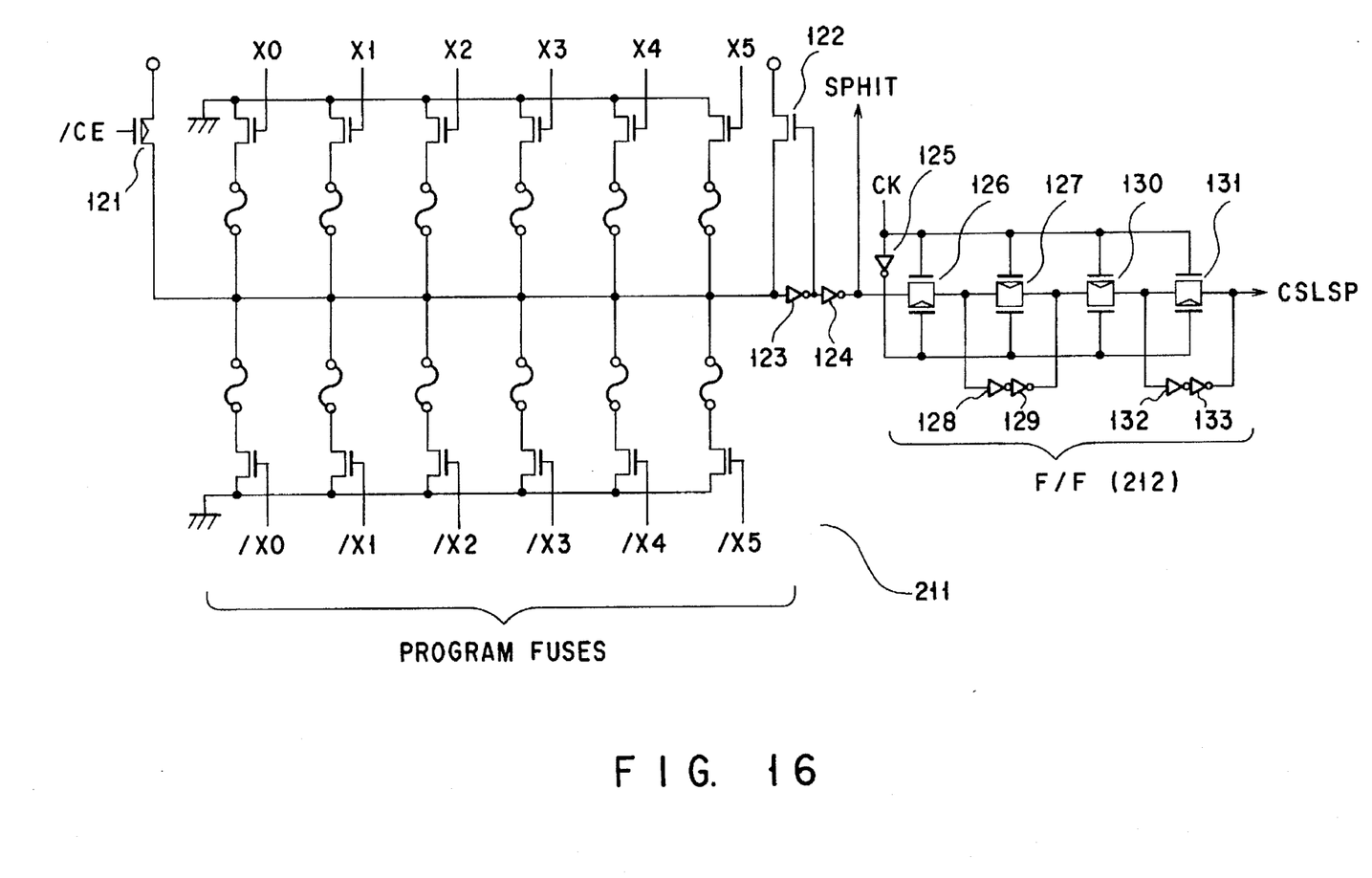
FIG. 16 is a circuit diagram of some important parts of FIG. 15.

FIG. 16 is a circuit diagram of the redundancy address judging circuit and the latch (F/F) in FIG. 15. The redundancy address judging circuit operates in a similar manner to the configuration of FIG. 9. Specifically, the program fuses are set so that when the address signals (X0 to X5 and their inverted signals /X0 to /X5) corresponding to the redundancy address are inputted to the program fuses, they may maintain the precharging potential supplied when signal /CE turn on the p-channel MOS transistor 121. With this setting, when the address signal corresponding to the redundancy address is inputted, signal SPHIT goes high and when an address signal other than the redundancy address is inputted, signal SPHIT goes low.

In synchronization with the rising of clock CK, signal SPHIT is taken into the latch (F/F) 212. The latch operation is triggered by the conduction of the transfer gate 126. At the same time that the latch (F/F) latches the signal, it outputs and maintains the signal SPHIT latched by clock CK in the immediately preceding period as signal CSLSP. In synchronization with the falling of the next clock, the transfer gates 127, 130 in the latch (F/F) conduct, thereby using signal SPHIT taken in the present period as a new signal CSLSP, which is then outputted.

The latches (F/F) 213 to 217 shown in FIG. 15 have the same configuration as that of the latch (F/F) 212 shown in FIG. 16. Specifically, the latches (F/F) take in the signal in synchronization with the rising of clock CK and at the same time, outputs and maintains the signal latched by clock CK in the immediately preceding period. Then, in synchronization with the falling of the next clock CK, they output the signal taken in the present period as a new output.

Figure 17:
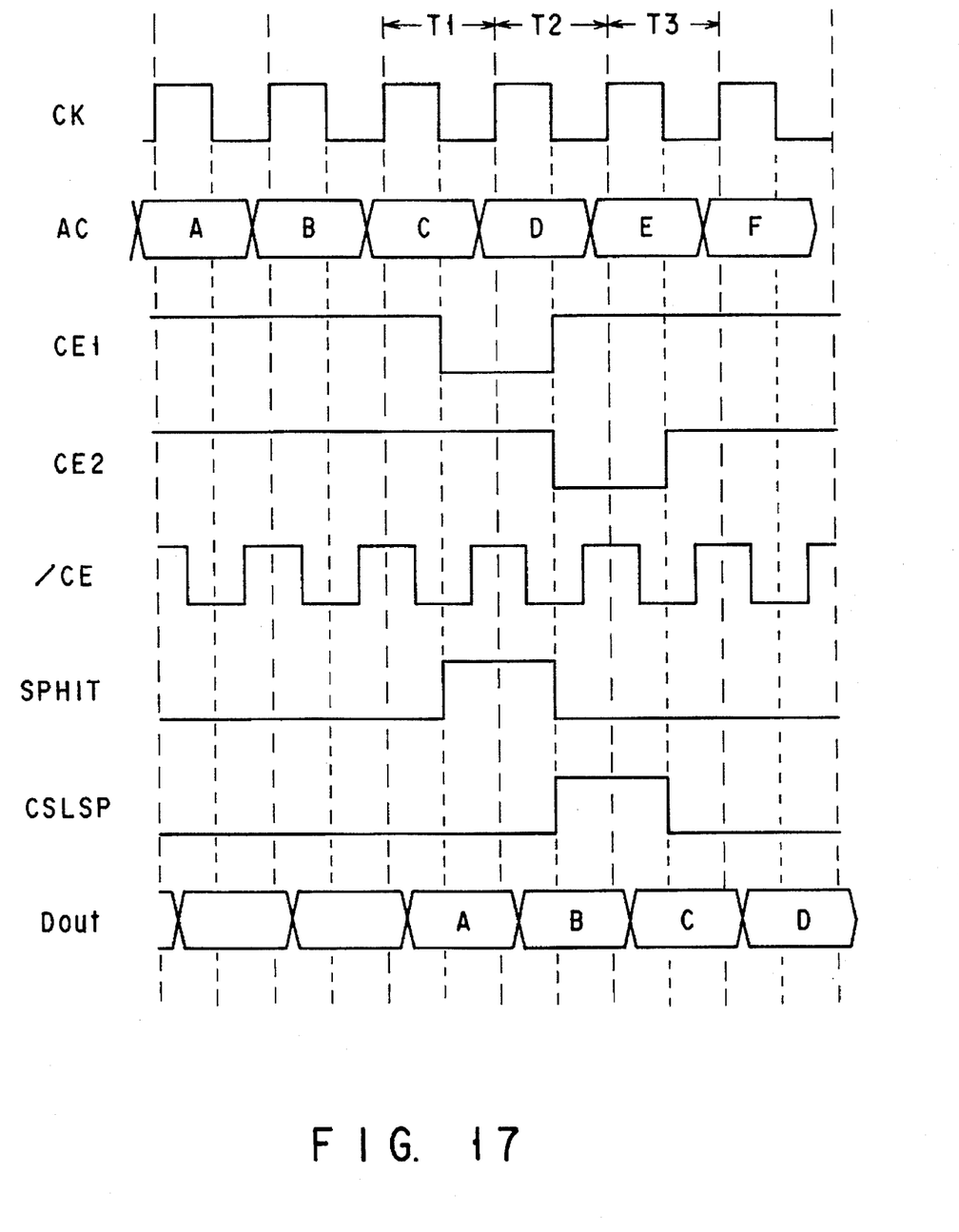
FIG. 17 is a waveform diagram for the operation of the circuit in FIG. 15.

The operation of the circuit of FIG. 15 will be described with reference to the waveform diagram of FIG. 17. Here, it is assumed that before the column address corresponding to the cell data to be read is inputted, a row decoder 201 determines a row line RL and the cell data is amplified at each sense amplifier (S/A) in a sense amplifier/latch circuit 208.

In period T1, (C) in column address signal AC is taken in by the F/F 213 at the rising of clock CK, and the output of F/F 213 is updated from address signal (B) to (C) at the falling of the clock CK. Here, the address signal (C) is the address for the column in which a defective column is present.

On the other hand, the latched output of F/F 214 on the column activating signal/CE is always high. In period T1, in the other F/F 212, 215, 216, the outputs are updated from the signal related to (A) in address signal AC to the signal related to (B). Furthermore, the F/F 217 outputs the address data corresponding to (A) in address signal AC at the falling of clock CK.

Furthermore, in the period T1, (C) in address signal AC is supplied to the redundancy address judging circuit 211 at the falling of clock CK. Although in the redundancy address judging circuit 211, signal/CE supplies a precharging potential, the input of the preceding address signal (B) makes signal SPHIT low. When (C) in address signal AC is supplied to the redundancy address judging circuit 211 at the falling of clock CK, signal SPHIT goes high. At this time, the judgment result of the preceding signal (B), a low level, is outputted as signal CSLSP. The high level of signal SPHIT brings the output of the inverter 218 into a low level, making one input to AND gate 219 low. This places the output CE1 of AND gate 218 at a low level.

In the following period T2, (C) in address signal is taken into the F/F 215 via a predecoder 203 at the rising of clock CK. The F/F 215 continues outputting (B) in the immediately preceding address signal until the falling of the next clock CK starts. At the falling of clock CK, the output of F/F 215 is updated from address signal (B) to (C).

In the period T2, a high level of signal SPHIT is taken in at the rising of clock CK. The F/F 212 continues outputting a low level of signal CSLSP corresponding to the low level of signal SPHIT, the judgment result of the immediately preceding address signal (B) until the falling of the next clock CK starts. At the falling of clock CK, the F/F 212 outputs a high level of signal CSLSP related to address signal (C).

In the period T2, a low level of signal CE1 is taken into the F/F 216 at the rising of clock CK. The F/F 216 continues outputting a high level of signal CE2 related to the immediately preceding address signal (B) until the falling of the next clock CK starts. At the falling of clock CK, the F/F 216 outputs a low level of signal CE1 related to address signal (C) as signal CE2.

At the falling of the clock in the period T2, the decoder starts to select address signal (C). With signal CE2 at a low level, the ordinary decoder 204 is not activated. Instead, with signal CSLSP at a high level, the spare decoder 204R is activated, allowing the address data from a redundancy cell area 207, in place of the address of the ordinary memory cell array, to be transmitted from the corresponding data register 206R to the F/F 217 via data lines DQ, /DQ and a sense amplifier 220, and taken into the F/F 217 at the rising of clock CK in period T3 (Dout). The F/F 217 outputs Dout at the falling of clock CK, thereby outputting the address data on the address signal (C) to the outside via a buffer (not shown).

The other operations of the F/F In period T2 will be explained. The F/F 213 takes in (D) in column address signal AC and outputs the latched data at the falling of clock CK.

Signal SPHIT is low at the redundancy address judging circuit. This makes signal CE1 high. The F/F 217 outputs the address data in the memory cell corresponding to (B) in address signal AC at the falling of clock CK.

The operation of an F/F other than F/F 217 in period T3 will be explained. The F/F 213 takes in (E) in column address signal AC at the rising of CK. The F/F 215, 212 take in (D) in column address signal AC, a low level of SPHIT for the address signal (D), and a high level of signal CE1 at the rising of CK, respectively. These F/F outputs the latched logic level at the falling of CK, causing the decoder to start a selecting operation for address signal (D). The decoder 204 is activated, selecting the data register 206 in the corresponding memory cell array. Then, the address data is transmitted to the F/F 217 via the data lines DQ./DQ and sense amplifier 220 by the rising of clock CK in the period following period T3.

With the above configuration, in a pipelining stage where a column line containing an analog operation area acting as a critical path for the memory operation is accessed to transmit the address data, in order not to introduce such a series of operations about address judgment at the redundancy circuit as reduces the operation margin, a series of operations about address judgment at the redundancy circuit is forced to finish in the immediately preceding pipelining stage. Namely, a latch circuit that separates stages is provided between the memory cell array and the redundancy address judging circuit.

As a result, even after the redundancy circuit has been provided, the operation period of the memory can be shortened, contributing to the speeding up of the memory device.

Additional advantages and modifications will readily occur to those skilled in the art. Therefore, the invention in its broader aspects is not limited to the specific details, and representative devices shown and described herein. Accordingly, various modifications may be made without departing from the spirit or 10 scope of the general inventive concept as defined by the appended claims and their equivalents.

What is claimed is:

1. A semiconductor memory device comprising:
    an address signal generating circuit to which a first address signal is input during a first memory cycle initiated by a first clock signal and from which the first address signal is output during the first memory cycle in response to a second clock signal;
    a memory cell array comprising memory cells arranged in rows and columns; and
    a decoder, synchronized with the second clock signal, for outputting a signal during a second memory cycle initiated by the first clock signal subsequent to the first memory cycle for accessing a column corresponding to the first address signal output by said address signal generating circuit during the first memory cycle, wherein
    during the second memory cycle, the first address signal is decoded and the column corresponding to the first address signal is accessed, and at the same time, a second address signal is input to said address signal generating circuit and output by said address signal generating circuit to said decoder.

2. A semiconductor memory device according to claim 1, further comprising:
    spare memory cells for replacing defective memory cells in said memory cell array;
    a spare decoder for accessing said spare memory cells;
    an address judging circuit having a judging operation for judgings whether said decoder or said spare decoder should be used to decode a particular address signal from said address signal generating circuit based on whether the particular address signal is a redundancy address specifying a column containing defective memory cells; and
    a delay circuit for delaying a signal for controlling the judging operation of said address judging circuit until the particular address signal from said address signal generating circuit is supplied to said address judging circuit.

3. A semiconductor memory device according to claim 2, wherein said address judging circuit latches judging data regarding a result of the judging operation in said delay circuit.

4. A semiconductor memory device according to claim 2, wherein said address judging circuit includes a charging circuit for charging a first node during a charging period, a judging circuit for judging whether said first node should be discharged after the charging period in accordance with whether the particular address signal is a redundancy address, a transfer control circuit for disconnecting said first node from a second node connected to an output of said address judging circuit during the charging period and for connecting said first node to said second node during a non-charging period, and a latch circuit for maintaining the state of said second node during the charging period.

5. A semiconductor memory device according to claim 2, wherein said delay circuit receives the second clock signal and delays the supply of the second clock signal to said address judging circuit until the particular address signal is supplied to said address judging circuit.

6. A semiconductor memory device according to claim 4, further comprising a signal control circuit for changing the state of said first node from the non-charging period to the charging period, when said first node has been in the non-charging period longer than a predetermined time.

7. A semiconductor memory device comprising:
    a memory cell array comprising memory cells and spare memory cells;
    decoder circuitry including a decoder and a spare decoder for selecting columns of said memory cells and said spare memory cells;
    an address signal latch arranged between an address signal input portion and said decoder circuitry for latching a first input address signal in synchronization with a clock signal which determines a first memory cycle;
    redundancy circuitry including a redundancy address judging circuit for judging whether the first input address signal specifies a redundancy address for a column containing a defective memory cell and, when the first input address signal specifies a redundancy address, for controlling said spare decoder to select a column containing a spare memory cell in place of a column containing the defective memory cell; and
    signal transfer control circuitry for ending an operation of said redundancy address judging circuit in the first memory cycle prior to the beginning of a second memory cycle in which said decoder circuitry selects the column line corresponding to the first input address signal, and for generating a signal for controlling said decoder circuitry as soon as the second memory cycle begins.

8. A semiconductor memory device according to claim 7, wherein a latch circuit for latching is provided between said redundancy address judging circuit and said memory cell array.

9. A semiconductor memory device according to claim 7, wherein said redundancy address judging circuit includes a charging circuit for charging a sensing node and a judging circuit having a judging operation for judging whether said sensing node should be discharged in a charging period, depending on whether the first input address signal specifies a redundancy address and outputs a result of the judging operation at said sensing node.

10. A semiconductor memory device according to claim 9, wherein said signal transfer control circuitry, in addition to said judging circuit, further comprises:
   a first flip-flop having a first state in which, in synchronization with the clock signal, the result of the judging operation of the first memory cycle is taken in and at the same time, the result of the judging operation of the immediately preceding memory cycle is latched and outputted, and a second state in which the result of the judging operation of the first memory cycle is transferred to an output node and outputted;
   a second flip-flop having said first and second states and outputting a signal complementary to said first flip-flop;
   a third flip-flop having a first state in which, in synchronization with the clock signal, the address signal from said address signal latch is taken in and at the same time, the address signal obtained during the immediately preceding memory cycle is latched and outputted, and a second state in which said taken-in address signal is transferred to an output node and outputted, wherein the outputs of said first and second flip-flops are used as activating control signals for the decoder circuitry and the output of said third flip-flop is used as an address signal by said decoder circuitry.

11. A semiconductor memory device comprising:
   an address signal generating circuit to which a first address signal is input during a first memory cycle initiated by a first clock signal and from which the first address signal is output during the first memory cycle in response to a second clock signal;
   a memory cell array comprising memory cells and spare memory cells arranged in rows and columns;
   a decoder, synchronized with the second clock signal, for outputting a signal during a second memory cycle initiated by the first clock signal subsequent to the first memory cycle for accessing a column corresponding to the first address signal output by said address signal generating circuit during the first memory cycle; and
   circuitry for decoding during a first portion of the first memory cycle the address signal generated by said address signal generating circuit in the memory cycle immediately preceding the first memory cycle and accessing during the first portion of the first memory cycle, the column corresponding to the address signal, and in a second portion of the first memory cycle, transferring an address signal generated by said address signal generating circuit for the first memory cycle to said decoder.

12. A semiconductor memory device according to claim 11, further comprising redundancy circuitry including a redundancy address judging circuit for judging whether the address signal is a redundancy address specifying a column containing a defective memory cell, said redundancy circuitry selecting a column line corresponding to a spare memory cell in place of said defective memory cell, wherein
   judging whether the address signal is a redundancy address is carried out within the first memory cycle, and switching the transfer path for the signal corresponding to the address signal to said redundancy circuitry when a redundancy address is sensed has been completed when a memory cycle in which said column line is accessed starts.

13. A semiconductor memory device according to claim 12, wherein said redundancy circuitry further includes a delay circuit for controlling the operation of judging the redundancy address until the address signal from said address signal generating circuit is supplied in judging the redundancy address, and a first latch circuit for latching judgment data regarding a result of whether the address is a redundancy address in said delay circuit, wherein said first latch circuit operates during the second portion of the first memory cycle.

14. A semiconductor memory device according to claim 13, wherein said delay circuit receives the second clock signal and delays the supply of the second clock signal to said redundancy address judging circuit until the address signal is supplied to said redundancy address judging circuit.

15. A semiconductor memory device according to claim 13, wherein said redundancy circuitry includes a charging circuit for charging a first node during a charging period, a judging circuit for judging whether said first node should be discharged after the charging period in accordance with whether the address signal is a redundancy address, a transfer control circuit for disconnecting said first node from a second node connected to an output of said redundancy address judging circuit during the charging period and for connecting said first node to said second node during a non-charging period, and a second latch circuit for latching the state of said second node during the charging period.

16. A semiconductor memory device according to claim 15, further comprising a signal control circuit for changing the state of said first node from the non-charging period to the charging period, when said first node has been in the non-charging period longer than a predetermined time.

17. A semiconductor memory device comprising:
   a memory cell array comprising memory cells and spare memory cells;
   storing circuits for storing data corresponding to selected memory cells in said memory cell array;
   decoder circuitry including a decoder and a spare decoder for selecting said storing circuits;
   an address signal latch for latching an address signal to access said memory cells in synchronization with a clock signal which determines a first memory cycle;
   redundancy circuitry including a redundancy address judging circuit for judging whether the address signal is a redundancy address specifying a column containing a defective memory cell and if the address signal is a redundancy address switching a transfer path of the address signal to said spare decoder which selects a storing circuit corresponding to a spare memory cell in place of said defective memory cell; and
   signal transfer control circuitry for controlling said redundancy address judging circuit during the memory cycle before the first memory cycle in which said decoder circuitry accesses the data corresponding to the address signal, and for generating a signal for controlling said decoder circuitry as soon as the first memory cycle starts.

18. A semiconductor memory device according to claim 17, wherein a latch circuit for latching a signal is provided between said redundancy address circuit and said memory cell array.

19. A semiconductor memory device according to claim 17, wherein said redundancy address judging circuit includes a charging circuit for charging a sensing node and a judging circuit having a judging operation for judging whether said sensing node should be discharged in a charging period accordance with whether the address signal specifies a redundancy address and outputs a result of the judging operation at said sensing node.

20. A semiconductor memory device according to claim 19, wherein said signal transfer control means, in addition to said judging device, further comprises:
   a first flip-flop having a first state in which, in synchronization with the clock signal, the result of the judging operation of the first memory cycle is taken in and at the same time, the result of the judging operation of the immediately preceding memory cycle is latched and outputted, and a second state in which the result of the judging operation of the first memory cycle is transferred to an output node and outputted;
   a second flip-flop having said first and second states and outputting a signal complementary to said first flip-flop;
   a third flip-flop a first state in which, in synchronization with the clock signal, the address signal from said address signal latch is taken in and at the same time, the address signal obtained during the immediately preceding memory cycle is latched and outputted, and a second state in which said taken-in address signal is transferred to an output node and outputted, wherein the outputs of said first and second flip-flops are used as activating control signals for the decoder circuitry and the output of said third flip-flop is used as an address signal by said decoder circuitry.

21. A semiconductor memory device comprising:
   a memory cell array comprising memory cells arranged in rows and columns for storing data;
   a decoder for selecting said memory cells;
   spare memory cells for replacing defective memory cells in said memory cell array;
   a spare decoder for selecting said spare memory cells;
   an address judging circuit having a judging operation for judging whether said decoder or said spare decoder should be used to decode an address signal for accessing said memory cell array based on whether the address signal is a redundancy address specifying a column containing defective memory cells; and
   a delay circuit for delaying a signal for controlling the judging operation of said address judging circuit until the address signal is supplied to said address judging circuit.

22. A semiconductor memory device according to claim 21, wherein said address judging circuit latches judging data regarding a result of the judging operation in said delay circuit.

23. A semiconductor memory device according to claim 21, wherein said address judging circuit includes a charging circuit for charging a first node during a charging period, a judging circuit for judging whether said first node should be discharged after the charging period in accordance with whether the address signal is a redundancy address, a transfer control circuit for disconnecting said first node from a second node connected to output of said address judging circuit during the charging period and for connecting said first node to said second node during a non-charging period, and a latch circuit for maintaining the state of said second node during the charging period.

24. A semiconductor memory device according to claim 21, wherein said delay circuit receives the second clock signal and delays the supply of the second clock signal to said address judging circuit until the address signal is supplied to said address judging circuit.

25. A semiconductor memory device according to claim 23, further comprising a signal control circuit for changing the state of said first node from the non-charging period to the charging period, when said first node has been in the non-charging period longer than a predetermined time.

26. A semiconductor memory device according to claim 1, wherein said address signal generating circuit comprises a binary counter.

27. A semiconductor memory device comprising:
   address signal generating circuits to which a first address signal is input during a first memory cycle initiated by a first clock signal and from which the first address signal is output during the first memory cycle in response to a second clock signal;
   a memory cell array comprising memory cells arranged in rows and columns; and
   address selection circuitry, synchronized with the second clock signal, for outputting a signal during a second memory cycle initiated by the first clock signal subsequent to the first memory cycle for accessing a column corresponding to the first address signal output by said address signal generating circuits during the first memory cycle, wherein
   said address signal generating circuits output a second address signal to said address selection circuitry for the second memory cycle at the same time as said address selection circuitry accesses the column corresponding to the first address signal.

* * * * *